United States Patent [19]

Chung et al.

[11] Patent Number: 5,585,296

[45] Date of Patent: Dec. 17, 1996

[54] METHOD OF FABRICATING MEMORY CELLS WITH BURIED BIT LINES

[75] Inventors: Cheng-Hui Chung, Hsinchu Hsien; Yi-Chung Sheng, Taichung; Belle Chia, Hsingtien, all of Taiwan

[73] Assignee: United Microelectronics Corporation, Taiwan

[21] Appl. No.: 599,923

[22] Filed: Feb. 12, 1996

[51] Int. Cl.⁶ ................................................ H01L 21/265
[52] U.S. Cl. ........................ 437/48; 437/52; 437/45
[58] Field of Search ........................ 437/48, 52, 60, 437/43, 238, 235, 45

[56] References Cited

U.S. PATENT DOCUMENTS 5,436,185  7/1995  Hsue et al. ................................ 437/48
5,504,030  4/1996  Chung et al. ............................. 437/52
5,525,535  6/1996  Hong ........................................ 437/70
5,536,669  7/1996  Su et al. ................................... 437/48

Primary Examiner—Jey Tsai
Attorney, Agent, or Firm—Law Office Of Steven M. Rabin, P.C.

[57] ABSTRACT

A method of fabricating memory cells with buried bit lines. In this method, a pad oxide layer is formed on a first conductivity-type silicon substrate. A photoresist layer is formed on the pad oxide layer while exposing predetermined areas of channels. A thick oxide layer is deposited by liquid phase deposition (LPD). The photoresist layer is removed. Second conductivity-type impurities are implanted to form source-drain electrodes using the thick oxide layer as a mask. The thick oxide layer and the pad oxide layer are removed to form bit lines and then word lines are formed crossing the bit lines, whereby the structure with buried bit lines and an array of memory cells is completed.

12 Claims, 3 Drawing Sheets

METHOD OF FABRICATING MEMORY CELLS WITH BURIED BIT LINES

BACKGROUND OF THE INVENTION

1. Field of the Invention

This invention relates in general to a method of fabricating memory cells and more particularly to a method of fabricating high density flat cells with buried bit lines by liquid phase deposition (LPD).

2. Description of Related Art

Memory ICs are widely used in an array of products that are becoming more and more light, thin, short, and small. This has increased the demand For memory ICs with high capacity, small surface area and high speed. In different sets of memory IC structures, memory cells with buried bit lines are widely used due to their smaller surface area and higher capacity. This is especially true For mask read-only memory (ROM), the most popular structure for mask ROMs.

To raise the density of high density flat cells with buried bit lines of a memory, the most effective way is to diminish the dimensions of each memory cell. However, to do so such problems as incomplete exposure of photoresist, and low memory cell punch-through voltage, still must be solved. To explain these problems in detail, partor the conventional process for fabricating mask read-oily memory (ROM) with buried bit lines is described below with reference to FIGS. 1a through 1c, which are schematic cross-sectional diagrams illustrating partof the conventional process of fabricating mask read-only memory with buried bit lines.

Referring to FIG. 1a, on a silicon substrate 11, such as a silicon substrate lightly doped with P-type impurities, a pad oxide layer 13 is formed as a protective layer for a later implantation process. A photoresist layer is coated over the pad oxide layer. The photoresist layer is exposed to light according to a predetermined pattern to change its solubility, and then part or photoresist material is removed in a developing process, whereby the photoresist layer 14 is completely formed while exposing areas for the source-drain electrodes.

Referring to FIG. 1b, when the implantation of impurities is performed, arsenic is generally adapted as an ion source because of its low diffusion coefficient, and N$^+$ source-drain electrodes 20 with high density N-type impurities are formed.

Referring to FIG. 1c, the photoresist layer 14 is removed and then the pad oxide layer 13 is removed, whereby the conventional process of forming buried bit lines is completed. Other parts of the process of fabricating a mask ROM will not be further discussed.

The width 22 of source-drain electrodes 20, which is called "line width," is the same as that of the exposed area of photoresist layer 14. The channel width, which is called "slit" 24, is the same as that of the area covered by photoresist layer 14. According to the above-described conventional process, the ratio of line width 22 to slit 24 is limited in current state-of-the-art exposure machines. When the sum of the two widths is about 0.72 µm, the following has been determined by experiment:

1. When the ratio of line width 22 to slit 24 is equal to or smaller than 0.565, the photoresist will not be exposed completely.
2. When the ratio of line width 22 to slit 24 is equal to or larger than 1.17, the photoresist will be exposed completely.

There are two methods to reduce the dimension of the memory cell, which are as follows:
1. Reducing slit 24

Increasing the ratio of line width 22 to slit 24 results in better exposure of the photoresist. However, the punch-through voltage of the memory cell will be greatly reduced.
2. Reducing line width 22

Reducing the ratio of line width 22 to slit 24 results in the photoresist not being exposed completely by a current state-of-the-art exposure machine, which causes problems for the production of the source-drain electrodes 20.

SUMMARY OF THE INVENTION

It is therefore an object of the invention to provide a method for fabricating memory cells with buried bit lines.

It is another object of the invention to provide a method to overcome the problems of incomplete exposure of photoresist and low memory cell punch-through voltage, in fabricating high density flat cells with buried bit lines.

The invention achieves the above-identified objects by providing a new method of fabricating memory cells with buried bit lines. It contains the following steps: A pad oxide layer is formed on a first conductivity-type silicon substrate. A photoresist layer is formed on the pad oxide layer and predetermined areas for the channels thereof are exposed to light and then removed. A thick oxide layer is deposited by liquid phase deposition (LPD). The remainder of the photoresist layer is then removed. Second conductivity-type impurities are implanted where the photoresist was removed, to form source-drain electrodes using the thick oxide layer as a mask. The thick oxide layer and the pad oxide layer are removed to form a plurality of bit lines. Then a plurality of word lines are formed crossing the bit lines, thereby to complete the structure with buried bit lines and an array of memory cells at the intersections of the crossing bit and word lines.

BRIEF DESCRIPTION OF THE DRAWINGS

Other objects, features, and advantages of the invention will become apparent by way of the following detailed description of the preferred but non-limiting embodiment. The description is made with reference to the accompanying drawings in which.

DESCRIPTION OF THE PREFERRED EMBODIMENT

Figure 1A:
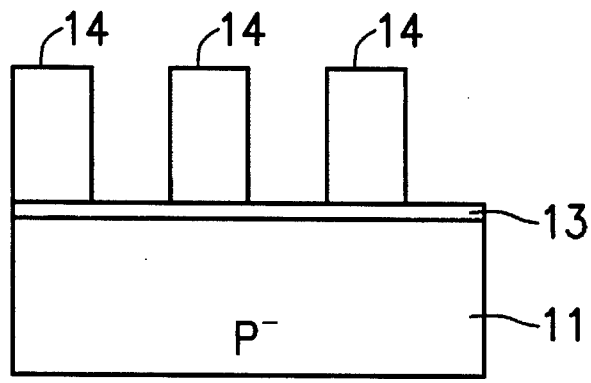
FIGS. 1a through 1c are schematic cross-sectional diagrams illustrating the conventional structure of a mask read-only memory with buried bit lines.
Figure 1B:
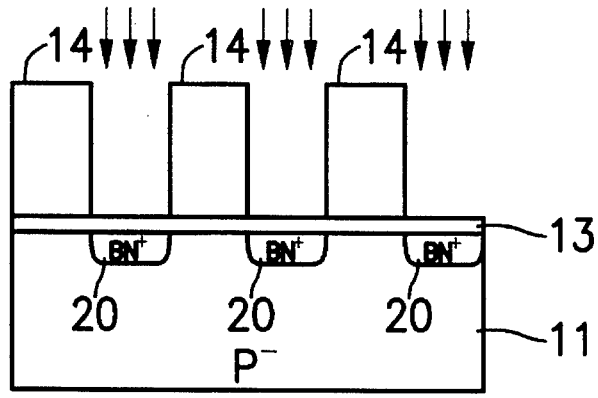
Figure 1C:
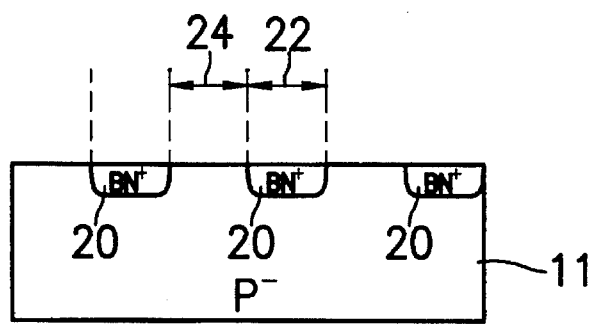
Figure 2A:
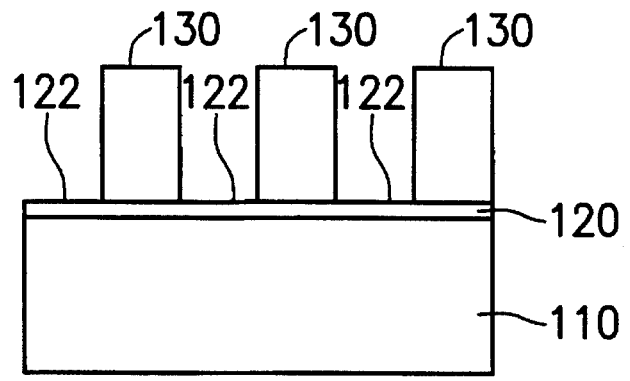
FIGS. 2a through 2f are schematic cross-sectional diagrams illustrating a preferred embodiment of the method of fabricating memory cells with buried bit lines according to the invention.

Referring to FIG. 2a, on a first conductivity-type silicon substrate 110, lightly doped with P-type impurities, a pad oxide layer 120 is formed as a protective layer for a later implanting process. A photoresist layer 130 is coated over the pad oxide layer 120, selectively exposed to light, and developed to expose closely spaced predetermined areas 122 of the pad oxide layer 120 over the channels.

Figure 2B:
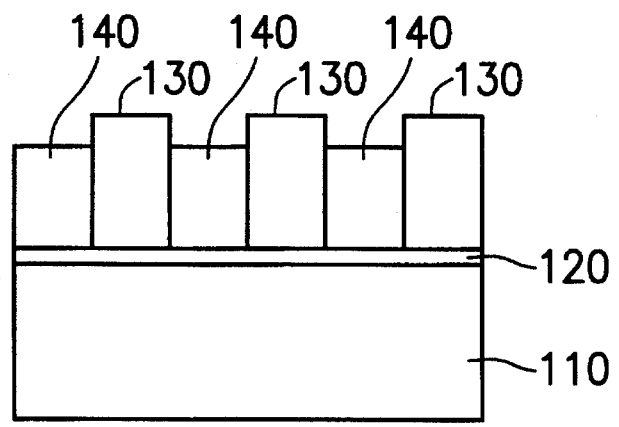

Referring to FIG. 2b, a thick oxide layer 140 is deposited by liquid phase deposition (LPD). According to the characteristics of liquid phase deposition, the thick oxide layer 140 is deposited over the exposed areas 122 above the channels.

Figure 2C:
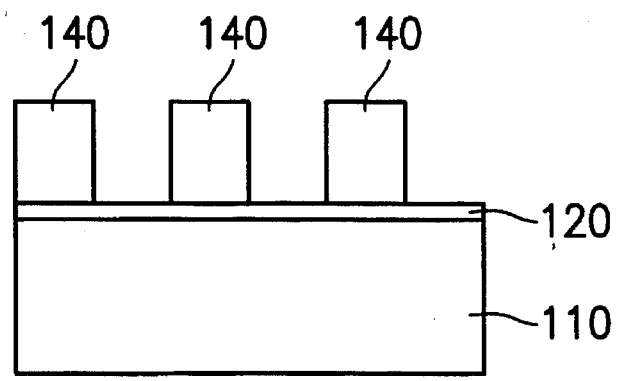

Next referring to FIG. 2c, the photoresist layer 130 is removed and the thick oxide layer 140 is left.

Figure 2D:
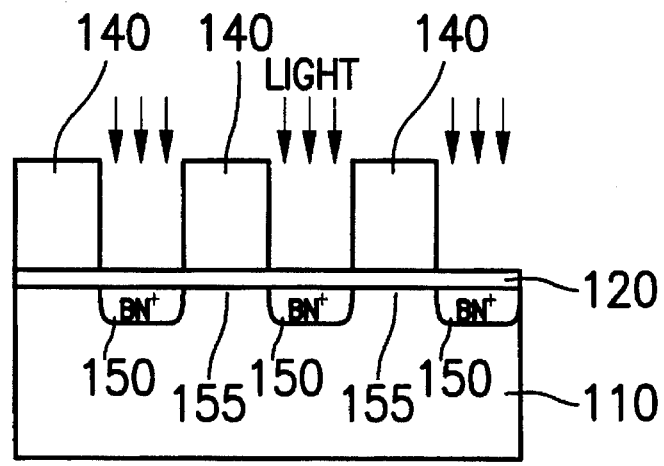

Referring to FIG. 2d, second conductivity-type impurities are implanted by using the thick oxide layer 140 as a mask. Since the above-mentioned first conductivity-type of the substrate is P-type, and the impurities should thus be N-type. Therefore, arsenic is generally chosen as the second conductivity-type ion source due to its low diffusion coefficient, and is used to form $N^+$ source-drain electrodes 150 with high density N-type impurities as the buried bit lines and define channels 155 therebetween. However, other N-type impurities can be used in this step. Moreover, the first and second conductivity-types may be reversed. In such a case, the second conductivity-type is P-type, and the impurities preferably are boron ions.

Figure 2E:
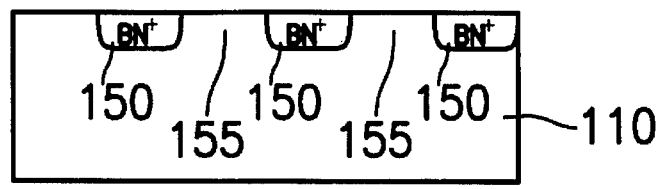

Next, referring to FIG. 2e, the thick oxide layer 140 is removed and then the pad oxide layer 120 is removed to expose the bit lines.

Figure 2F:
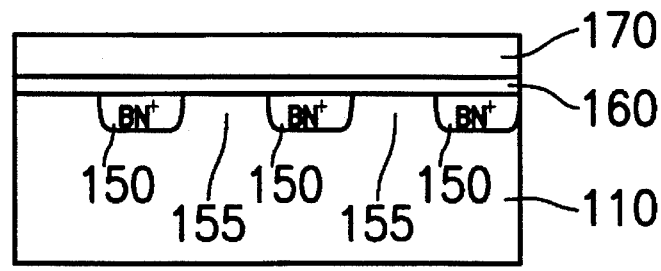

Referring to FIG. 2f, a gate oxide layer 160 and a polysilicon gate 170 are formed in sequence to provide a plurality of word lines crossing the bit lines, thereby completing the process of fabricating mask read-only memory according to the invention, with buried bit lines and memory cells defined at the intersections of the word and bit lines.

According to the preferred embodiment of the invention, the photoresist layer 130 is processed to expose the predetermined wide areas of channels 155, and the thick oxide layer 140 is deposited by liquid phase deposition and used as a mask when impurities are implanted, so that several results can be obtained as described below:

1. Because the photoresist layer 130 is used in a way to expose wider channels 155, the conventional problems of incomplete exposure of photoresist and defects of source-drain electrodes, that result in diminishing the width of source-drain electrodes, will not occur in memory cells fabricated according to the method of the invention.

2. Because the wide channels 155 are completely exposed, the memory cell punch-through voltage will not be reduced.

It should be noted that the invention can be applied to not only the mask ROM mentioned above, but also other memory cell structures with buried bit lines. Nowadays, integrated circuits are being developed at the sub-micron level. The invention provides an effective method to overcome the problems of incomplete exposure of photoresist and low memory cell punch-through voltage in fabricating a high density of flat cells with buried bit lines.

While the invention has been described by way of example and in terms of a preferred embodiment, it is to be understood that the invention is not limited to the disclosed embodiment. To the contrary, it is intended to cover various modifications and similar arrangements included within the spirit of the invention, limited only by the appended claims, the scope of which should be accorded the broadest interpretation so as to encompass all such modifications and similar structures.

What is claimed is:

1. A method of fabricating memory cells with buried bit lines, comprising the steps of:

forming a pad oxide layer on a first conductivity-type silicon substrate;

forming a photoresist layer on the pad oxide layer while exposing a channel region of the substrate;

depositing a thick oxide layer by liquid phase deposition;

removing the photoresist layer;

forming source/drain regions in the substrate by implanting second conductivity-type impurities while using the thick oxide layer as a mask;

removing the thick oxide layer and the pad oxide layer so that the source/drain regions form a plurality of buried bit lines; and forming a plurality of word lines which, with the bit lines, define an array of memory cells.

2. A method according to claim 1, wherein the memory cell with buried bit lines is a read-only memory.

3. A method according to claim 2, wherein the first conductivity-type is P-type and the second conductivity-type is N-type.

4. A method according to claim 3, wherein the impurities are arsenic ions.

5. A method according to claim 2, wherein the first conductivity-type is N-type and the second conductivity-type is P-type.

6. A method according to claim 5, wherein the impurities are boron ions.

7. A method of fabricating memory cells, comprising the steps of:

a. forming a pad oxide layer on first-conductivity type silicon substrate;

b. forming a photoresist layer on the pad oxide layer and applying light selectively to areas of the photoresist layer;

c. removing the light applied areas of photoresist layer to expose areas of the pad oxide layer;

d. depositing a thick oxide layer over the exposed areas of the pad oxide layer;

e. removing remaining portions of the photoresist after said step d;

f. forming source/drain regions in the substrate after said step e, by implanting second conductivity-type impurities in the substrate while using the thick oxide layer as a mask;

g. removing the thick oxide layer and the pad oxide layer so that the source/drain regions are exposed; and h. forming a plurality of word lines crossing the source/drain regions, the source/drain regions forming buried bit lines that with the crossing word lines define an array of memory cells.

8. A method according to claim 7; wherein the memory cell with buried bit lines is a read-only memory.

9. A method according to claim 8, wherein the first conductivity-type is P-type and the second conductivity-type is N-type.

10. A method according to claim 9, wherein the impurities are arsenic ions.

11. A method according to claim 8, wherein the first conductivity-type is N-type and the second conductivity-type is P-type.

12. A method according to claim 11, wherein the impurities are boron ions.

* * * * *